United States Patent [19]
Satou et al.

[11] Patent Number: 5,138,195
[45] Date of Patent: Aug. 11, 1992

[54] BI-CMOS LOGIC CIRCUIT HAVING FULL VOLTAGE SWING AND RAPID TURN-OFF

[75] Inventors: Shinzou Satou; Kou Ebihara, both of Kawasaki; Toru Nakamura, Kushikino; Toshiyuki Koreeda, Sendai, all of Japan

[73] Assignee: Fujitsu Limited, Kawasaki, Japan

[21] Appl. No.: 599,879

[22] Filed: Oct. 19, 1990

Related U.S. Application Data

[63] Continuation-in-part of Ser. No. 525,058, May 18, 1990.

[30] Foreign Application Priority Data

May 19, 1989 [JP] Japan .................. 1-127402
Oct. 27, 1989 [JP] Japan .................. 1-281317

[51] Int. Cl.⁵ .......................................... H03K 17/04
[52] U.S. Cl. .................. 307/446; 307/443; 307/570
[58] Field of Search ............ 307/446, 570, 475, 450, 307/451, 279, 443

[56] References Cited

U.S. PATENT DOCUMENTS

| | | | |
|---|---|---|---|
| 4,694,202 | 9/1987 | Iwamura et al. | 307/446 X |
| 4,719,373 | 1/1988 | Masuda et al. | 307/446 X |
| 4,804,869 | 2/1989 | Masuda et al. | 307/446 |
| 4,845,385 | 7/1989 | Ruth, Jr. | 307/446 |
| 4,883,988 | 11/1989 | Ide et al. | 307/446 X |
| 4,890,017 | 12/1989 | Masuda et al. | 307/446 |
| 4,948,990 | 8/1990 | Shin et al. | 307/446 |

FOREIGN PATENT DOCUMENTS

| | | | |
|---|---|---|---|
| 0099100 | 1/1984 | European Pat. Off. | 307/446 |
| 64-68021 | 3/1989 | Japan | 307/446 |

*Primary Examiner*—David Hudspeth
*Attorney, Agent, or Firm*—Staas & Halsey

[57] ABSTRACT

A Bi-CMOS logic circuit includes first and second bipolar transistors connected in series between a first power source and a second power source. An output signal is drawn from a connection node at which first and second bipolar transistors are connected in series. The Bi-CMOS logic circuit also includes a first impedance element, connected between a base and an emitter of the first bipolar transistor, providing a first impedance, and a second impedance element, connected between a base of the second bipolar transistor and an emitter thereof, providing a second impedance. Further, the Bi-CMOS logic circuit includes a first MOS transistor connected between the collector of the first bipolar transistor and the base thereof, a second MOS transistor connected between the collector of the second bipolar transistor and the base thereof, an input signal being applied to gates of the first and second MOS transistors; and a third MOS transistor connected between the base of the first bipolar transistor and the second power source. The third MOS transistor has the gate thereof connected to the base of the second bipolar transistor.

6 Claims, 7 Drawing Sheets

BI-CMOS LOGIC CIRCUIT HAVING FULL VOLTAGE SWING AND RAPID TURN-OFF

CROSS-REFERENCE TO RELATED APPLICATIONS

This application is a continuation-in-part of application Ser. No. 525,058, filed May 18, 1990 for Bi-CMOS Logic Circuit, commonly assigned with the present invention.

BACKGROUND OF THE INVENTION

The present invention generally relates to a Bi-CMOS logic circuit, and more particularly to an improvement in the rise and fall characteristics of an output signal from the Bi-CMOS logic circuit.

As is well known, a Bi-CMOS logic circuit is composed of a bipolar element and a CMOS (complementary metal oxide semiconductor transistor) element. Referring to FIG. 1, there is illustrated a conventional Bi-CMOS logic circuit, which includes a CMOS inverter composed of a P-channel MOS transistor MP1 and an N-channel MOS transistor MN1 and a pair of bipolar transistors Q1 and Q2. The Bi-CMOS logic circuit has a high operating speed characteristic afforded by the bipolar transistor pair and a low power consumption characteristic afforded by the CMOS inverter. A resistor R1 (impedance circuit) is connected between the base and emitter of the bipolar transistor Q1 and a resistor R2 (impedance circuit) is connected between the base and emitter of the bipolar transistor Q2. An output terminal OUT of the Bi-CMOS logic circuit is grounded through a wiring load capacitance C, which is a parasitic capacitance.

The bipolar transistors Q1 and Q2 are connected in series between a positive power source Vcc and a negative power source (ground). The output signal from the Bi-CMOS logic circuit is drawn from a connection node at which the emitter of the bipolar transistor Q1 is connected to the collector of the bipolar transistor Q2. The MOS transistor MP1 is connected between the collector and base of the bipolar transistor Q1. The MOS transistor MN1 is connected between the collector and base of the bipolar transistor Q2. An input signal applied to an input terminal IN is supplied to the gates of the MOS transistors MP1 and MN1.

When the input signal (also indicated by IN) changes from a high (H) level (approximately equal to the power source voltage Vcc) to a low level (approximately equal to the ground potential), the MOS transistor MP1 is switched from OFF to ON. In response to this change in the state of the MOS transistor MP1, the bipolar transistor Q1 is turned ON. Thus, the wiring load capacitance C is charged so that the output signal (also indicated by OUT) at the output terminal OUT is changed from the low level to the high level.

During the time when the voltage of the output terminal OUT increases to a potential equal to $Vcc - V_{BE}$ (base-emitter voltage of the bipolar transistor Q1), most of current passes through the bipolar transistor Q1. This is due to the fact that the current drivability of the bipolar transistor Q1 is greater than that of the MOS transistor MP1. The current passing through the bipolar transistor Q1 charges the wiring load capacitance C. When the collector-emitter voltage of the bipolar transistor Q1 becomes equal to or greater than the base-emitter voltage $V_{BE}$ thereof, the bipolar transistor Q1 cannot pass current. In this state, the wiring load capacitance C is charged by a current passing through the MOS transistor MP1 and the resistor R1. Thereby, the voltage of the output terminal OUT gradually increases toward the power source voltage Vcc and finally becomes equal to the high level (approximately equal to Vcc).

On the other hand, when the input signal changes from the low level to the high level, the MOS transistor MP1 is switched from ON to OFF and the MOS transistor MN1 is switched from OFF to ON. In response to this change in the state of the MOS transistor MN1, the bipolar transistor Q2 is turned ON. Thus, the wiring load capacitance C is discharged through the bipolar transistor Q2 so that the voltage of the output terminal OUT is changed from the high level to the low level. Until the time when the voltage of the output terminal OUT decreases to the base-emitter voltage $V_{BE}$ of the bipolar transistor Q2, most of current passes through the bipolar transistor Q2. This is due to the fact that the current drivability of the bipolar transistor Q2 is greater than that of the MOS transistor MN1. When the collector-emitter voltage of the bipolar transistor Q2 becomes equal to or less than the base-emitter voltage $V_{BE}$ thereof, the bipolar transistor cannot pass current. Thus, the wiring load capacitance C is gradually discharged through the MOS transistor MN1 and the resistor R2 and finally becomes equal to the low level (approximately equal to the ground potential).

A description will now be given of the disadvantages of the above-mentioned conventional Bi-CMOS logic circuit with reference to FIG. 2. FIG. 2 is a waveform diagram of the output signal OUT obtained at the output terminal OUT. A letter "a" denotes the potential difference between the emitter and base of the bipolar transistor Q1, and a letter "b" denotes the potential difference between the emitter and base of the bipolar transistor Q2. A letter "c" denotes the time it takes the output voltage to increase by the potential difference "a", and a letter "d" denotes the time it takes the output voltage decreases by the potential difference "b".

As shown in FIG. 2, the signal waveform of the output signal OUT rises rapidly. After that, during the time "c", the current passing through the resistor R1 charges the wiring load capacitance C so that the voltage of the output terminal OUT increases gradually by the base-emitter voltage $V_{BE}$ of the bipolar transistor Q1. The time when the current is passing through the wiring load capacitance C is based on the time constant of R1 and C. Thus, it takes a long time for the output voltage to increase to the high level so that a rounding of the waveform of the output signal appears during the time "c". Similarly, during the time "d", the current from the wiring load capacitance C passes through the resistor R2 so that the wiring load capacitance is gradually discharged. Thus, a rounding of the falling waveform of the output signal appears during the time "d". Thus, the period at which the output signal is maintained at the high level (approximately equal to Vcc) is short, which causes jitter, particularly when the Bi-CMOS logic circuit operates at high frequencies.

SUMMARY OF THE INVENTION

It is a general object of the present invention to provide an improved Bi-CMOS logic circuit in which the above-mentioned disadvantages are eliminated.

A more specific object of the present invention is to provide a Bi-CMOS logic circuit capable of providing decreased rounding of the output waveform and decreased jitter.

The above-mentioned objects of the present invention are achieved by a Bi-CMOS logic circuit comprises first and second bipolar transistors connected in series between a first power source and a second power source. An output signal is drawn from a connection node where the first and second bipolar transistors are connected in series. The Bi-CMOS logic circuit also comprises a first impedance element, connected between a base and an emitter of the first bipolar transistor, providing a first impedance, and a second impedance element, connected between a base of the second bipolar transistor and an emitter thereof, for providing a second impedance. Further, the Bi-CMOS logic circuit comprises a first MOS transistor connected between a collector of the first bipolar transistor and the base thereof, a second MOS transistor connected between a collector of the second bipolar transistor and the base thereof, an input signal being applied to gates of the first and second MOS transistors; and a third MOS transistor connected between the base of the first bipolar transistor and the second power source. The third MOS transistor has a gate connected to the base of the second bipolar transistor.

The aforementioned objects of the present invention are also achieved by a Bi-CMOS logic circuit comprising first and second bipolar transistors connected in series between a first power source and a second power source, an output signal being drawn from a connection node where the first and second bipolar transistors are connected in series. The Bi-CMOS logic circuit also comprises a first impedance element, connected between a base and an emitter of the first bipolar transistor, providing a first impedance, and a second impedance element, connected between a base of the second bipolar transistor and an emitter thereof, for providing a second impedance. Further, the Bi-CMOS logic circuit comprises a first group of n MOS transistors connected in parallel form between the base and emitter of the first bipolar transistor where n is an integer, the n MOS transistors of the first group having gates respectively receiving n input signals, a second group of n MOS transistors connected in series between base and collector of the second bipolar transistor, the n MOS transistors of the second group having gates respectively receiving the n input signals, and a discharge MOS transistor connected between the base of the first bipolar MOS transistor and the second power source, the discharge MOS transistor having a gate connected to the base of the second bipolar transistor.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 3:
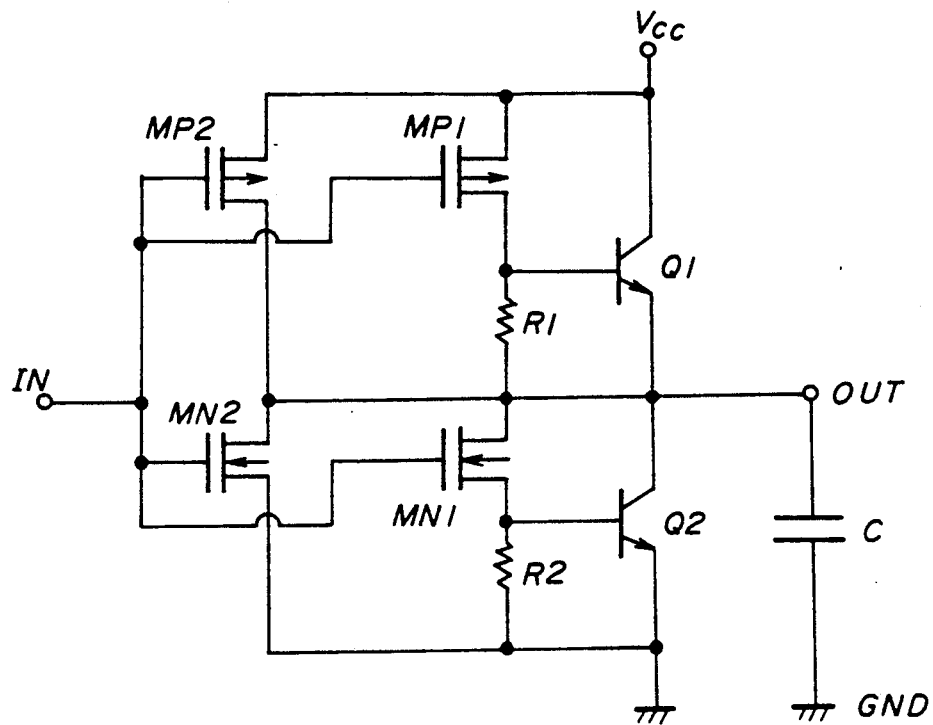
FIG. 3 is a circuit diagram of a Bi-CMOS logic circuit according to a first preferred embodiment of the present invention.

A description will now be given of a Bi-CMOS logic circuit according to the first preferred embodiment of the present invention with reference to FIG. 3. In FIG. 3, those parts which are the same as those shown in FIG. 1 are given the same reference numerals.

Figure 1:
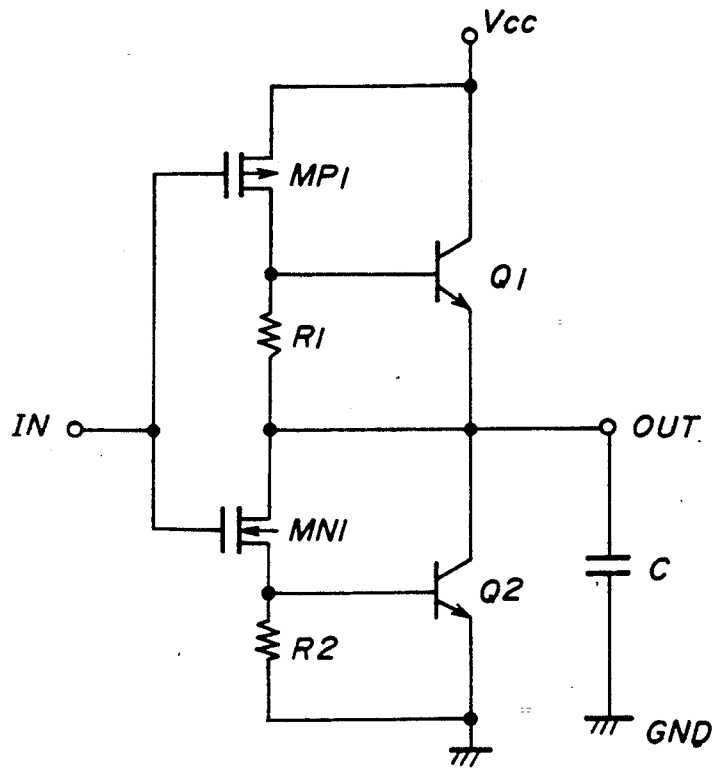
FIG. 1 is a circuit diagram of a conventional Bi-CMOS logic circuit.
Figure 2:
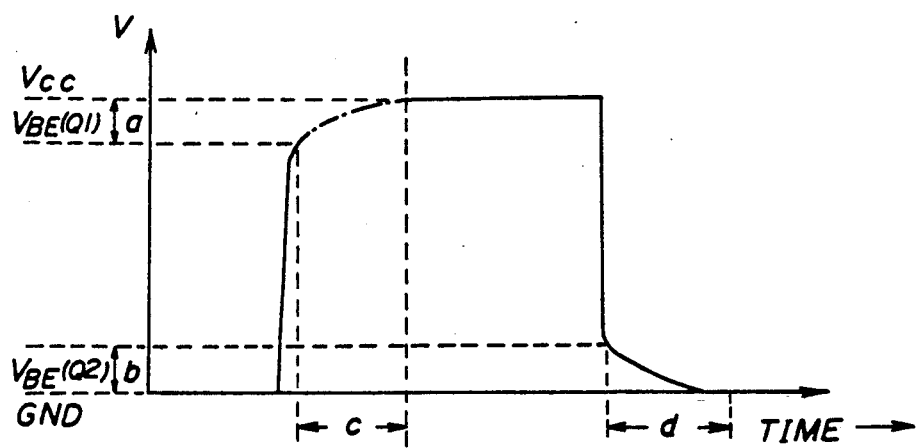
FIG. 2 is a waveform diagram illustrating disadvantages of the conventional Bi-CMOS logic circuit shown in FIG. 1.

According to the first embodiment of the present invention, P-channel MOS transistor MP2 and N-channel MOS transistor MN2, related as a pair are added to the configuration shown in FIG. 1. The MOS transistor MP2 is connected between the collector and emitter of the bipolar transistor Q1. That is, the source and drain of the MOS transistor MP2 are connected to the collector and emitter, respectively, of the bipolar transistor Q1. Similarly, the MOS transistor MN2 is connected between the collector and emitter of the bipolar transistor Q2. That is, the drain and source of the MOS transistor MN2 are connected to the collector and emitter, respectively, of the bipolar transistor Q2. The input signal IN through the input terminal IN is applied to the gates of the MOS transistors MP2 and MN2.

When the input signal changes from the high level to the low level, the MOS transistors MP1 and MP2 are switched from OFF to ON, and the MOS transistors MN1 and MN2 are switched from ON to OFF. In this change in the status of the MOS transistor MP1, the bipolar transistor Q1 is turned ON and charges the wiring load capacitance C. Thus, the output voltage of the output terminal OUT is changed from the low level to the high level. During this operation, current from the power source Vcc passes through the bipolar transistor Q1 and charges the wiring load capacitance C until the output voltage increases to the potential equal to $Vcc - V_{BE}$ (base-emitter voltage of the bipolar transistor Q1). Thus, the output voltage rises rapidly. It will be noted that the current drivability of the bipolar transistor Q1 is greater than that of each of the MOS transistors MP1 and MP2. When the output voltage has become equal to $Vcc - V_{BE}$, current starts to pass through the MOS transistor MP2 and charges the wiring load capacitance C. It will be noted that the MOS transistor MP2 operates at a speed greater than that of the resistor R1.

On the other hand, when the input signal changes from the low level to the high level, the MOS transistors MP1 and MP2 are switched from ON to OFF, and the MOS transistors MN1 and MN2 are switched from OFF to ON. Since the MOS transistor MN1 is turned ON, the bipolar transistor Q2 is also turned ON. Thus the wiring load capacitance C is discharged so that the output voltage of the output terminal OUT is changed from the high level to the low level. During the discharging operation, current from the wiring load capacitance C passes through the bipolar transistor Q2 until the output voltage decreases to the base-emitter voltage $V_{BE}$ of the bipolar transistor Q2. Thus, the output voltage decreases rapidly. It will be noted that the current drivability of the bipolar transistor Q2 is greater than that of each of the MOS transistors MN1 and MN2. When the output voltage has become equal to $V_{BE}$ of the bipolar transistor Q2, current from the wiring load capacitance C starts to pass through the MOS transistor MN2 so that the output voltage becomes approximately equal to the low level (approximately equal to the ground level). It will be noted that the MOS transistor MN2 operates at a speed greater than that of the resistor R2.

Figure 4:
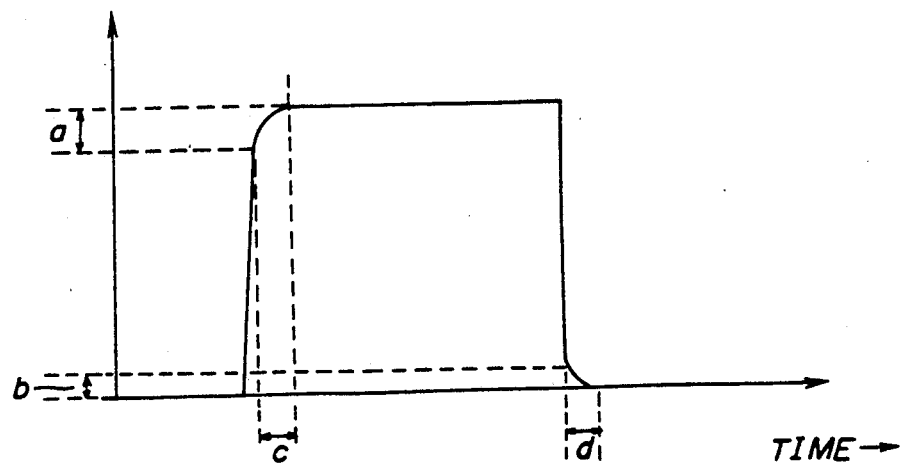
FIG. 4 is a waveform diagram of an output signal from the Bi-CMOS logic circuit shown in FIG. 3.

FIG. 4 is a waveform diagram of the output signal obtained at the output terminal OUT shown in FIG. 3. The letters "a", "b", "c" and "d" are as follows. Letter "a" denotes the potential difference between the emitter and base of the bipolar transistor Q1, and letter "b" denotes the potential difference between the emitter and base of the bipolar transistor Q2. Letter "c" denotes the time it takes the output voltage to increase by the potential difference "a", and letter "d" denotes the time it takes the output voltage to decrease by the potential difference "b".

During the time "c", the current passes through the MOS transistor MP2 and charges the wiring load capacitance C by the base-emitter voltage $V_{BE}$ of the bipolar transistor Q1. Thus, it is possible to increase the output voltage to the high level (approximately equal to Vcc) during a reduced time, as compared with the aforementioned conventional circuit in which the wiring load capacitance C is charged by the current which passes through the resistor R1. According to the configuration shown in FIG. 3, it takes about 0.2 ns to increase the output signal to the high level. Thus, the rising waveform of the output signal has a reduced rounding, as shown in FIG. 4. It will be noted that according to the aforementioned conventional circuit it takes about 1.6 ns to increase the output signal to the high level.

During the time "d", current from the wiring load capacitance C passes through the MOS transistor MN2. Thus, it becomes possible to decrease the output voltage to the low level (approximately equal to the ground potential) during a reduced time, as compared with the aforementioned conventional circuit in which the current from the wiring load capacitance C passes through the resistor R2. Thus the falling waveform of the output signal has a reduced rounding, as shown in FIG. 4. It should be particularly noted that the output signal can be maintained at the high level during a lengthened period of time. Thus, it is possible to suppress the occurrence of jitter. Thus, the circuit shown in FIG. 3 can operate at higher frequencies.

When it is desired to eliminate only the rounding of the rising waveform, it is possible to provide only the MOS transistor MP2. That is, the MOS transistor MN2 may be omitted. On the other hand, when it is desired to eliminate only the rounding the falling waveform, it is possible to provide only the MOS transistor MN2.

Figure 5:
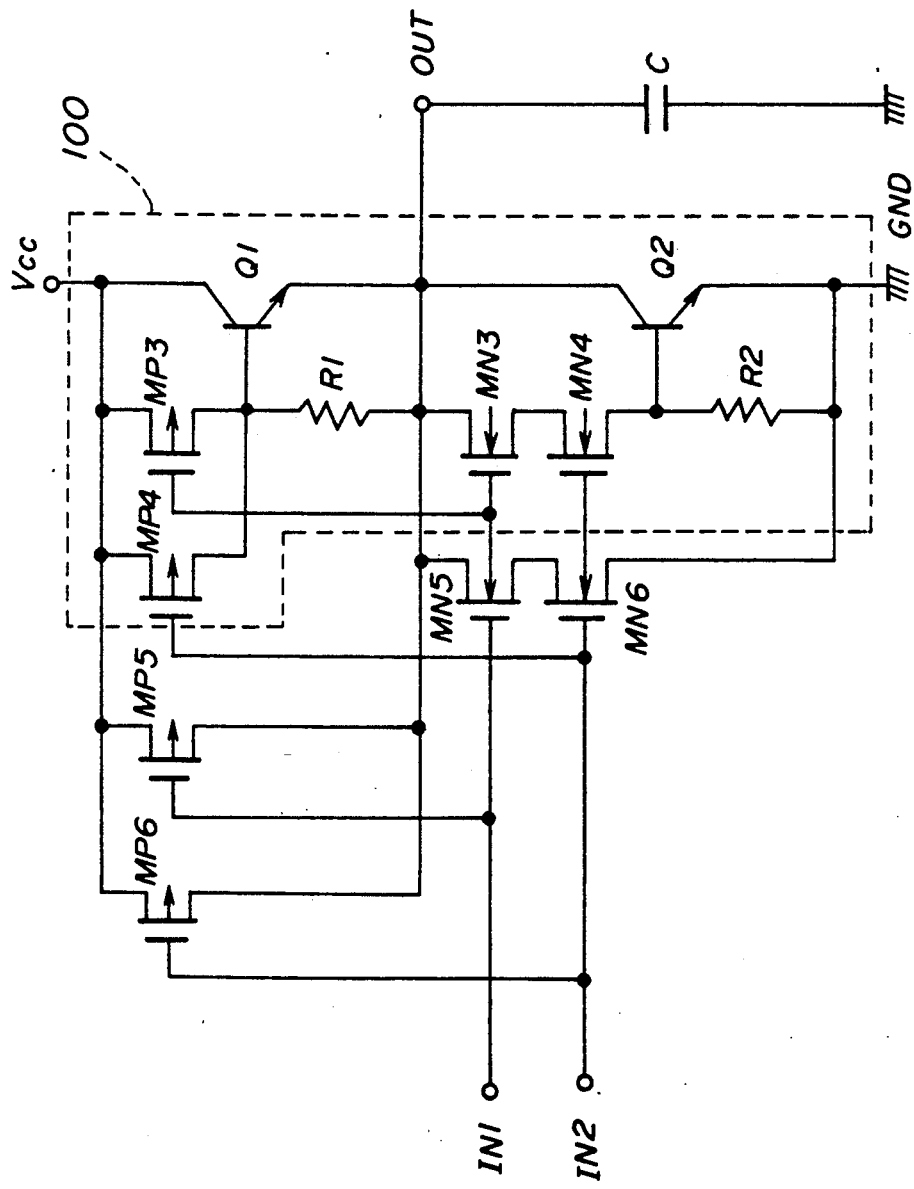
FIG. 5 is a circuit diagram of a Bi-CMOS logic circuit according to a second preferred embodiment of the present invention.

A description will now be given of a Bi-CMOS logic circuit according to a second preferred embodiment of the present invention with reference to FIG. 5. The Bi-CMOS logic circuit shown in FIG. 5 is a two-input NAND gate. A conventional NAND gate 100 is made up of two bipolar transistors Q1 and Q2, two P-channel MOS transistors MP3 and MP4 and two N-channel MOS transistor MN3 and MN4. According to the second embodiment of the present invention, two P-channel MOS transistors MP5 and MP6 and two N-channel MOS transistors MN5 and MN6 are added to the conventional NAND gate 100. The source and drain of each of the MOS transistors MP5 and MP6 are connected to the collector and emitter, respectively, of the bipolar transistor Q1. An input signal IN1 is applied to the gate of the MOS transistor MP5, and an input signal IN2 is applied to the gate of the MOS transistor MP6. The MOS transistors MN5 and MN6 are connected in series between the collector and emitter of the bipolar transistor Q2. That is, the drain of the MOS transistor MN5 is connected to the collector of the bipolar transistor Q2, and the source thereof is connected to the drain of the MOS transistor MN6. The source of the MOS transistor MN6 is grounded.

Each of the MOS transistors MP3 and MP4 is connected between the collector and emitter of the bipolar transistor Q1. The input signals IN1 and IN2 are applied to the gates of the MOS transistors MP3 and MP4, respectively. The MOS transistors MN3 and MN4 are connected in series between the collector and base of the bipolar transistor Q2. The input signals IN1 and IN2 are applied to the gates of the MOS transistors MN3 and MN4, respectively.

It is now assumed that no charge is stored in the wiring load capacitance C. In this state, when the input signal IN1 changes from the high level to the low level (while the input signal is maintained at the high level), the MOS transistor MP3 is switched from OFF to ON so that current passes through the bipolar transistor Q1 and charges the wiring load capacitance C. The MOS transistor MP5 is also turned ON when the input signal IN1 changes from the high level to the low level. As the drivability of the bipolar transistor Q1 is greater than the drivability of the MOS transistor MP5, most of current from the power source Vcc passes through the bipolar transistor Q1. When the output voltage has become equal to Vcc−$V_{BE}$ (base-emitter voltage of the bipolar transistor Q1), the bipolar transistor Q1 cannot pass current from the power source Vcc. Instead, the current from the power source Vcc passes through the MOS transistor MP5 and charges the wiring load capacitance C. Thus, the output voltage is rapidly increased by the base-emitter voltage $V_{BE}$ of the bipolar transistor Q1 so that the output signal becomes approximately equal to the power source voltage Vcc.

In this state, when the input signal IN1 changes from the low level to the high level (the input signal IN2 is maintained at the high level), the MOS transistors MN3 and MN5 are turned ON so that all the N-channel MOS transistors MN3-MN6 are ON. The current from the wiring load capacitance C is allowed to pass through the bipolar transistor Q2 so that the output voltage rapidly decreases by Vcc−$V_{BE}$ (the emitter-base voltage of the bipolar transistor Q2). After that, the bipolar transistor Q2 no longer passes any current. Instead, the current from the wiring load capacitance C passes through the MOS transistors MN5 and MN6 so that the output voltage is rapidly decreased approximately to the ground potential. It will be noted that the current drivability of each of the MOS transistors MN5 and MN6 is greater than the resistor R2.

In the above-mentioned second embodiment of the present invention, it is also possible to provide either a pair of MOS transistors MP5 and MN5 or a pair of MOS transistors MP6 and MN6.

Figure 6:
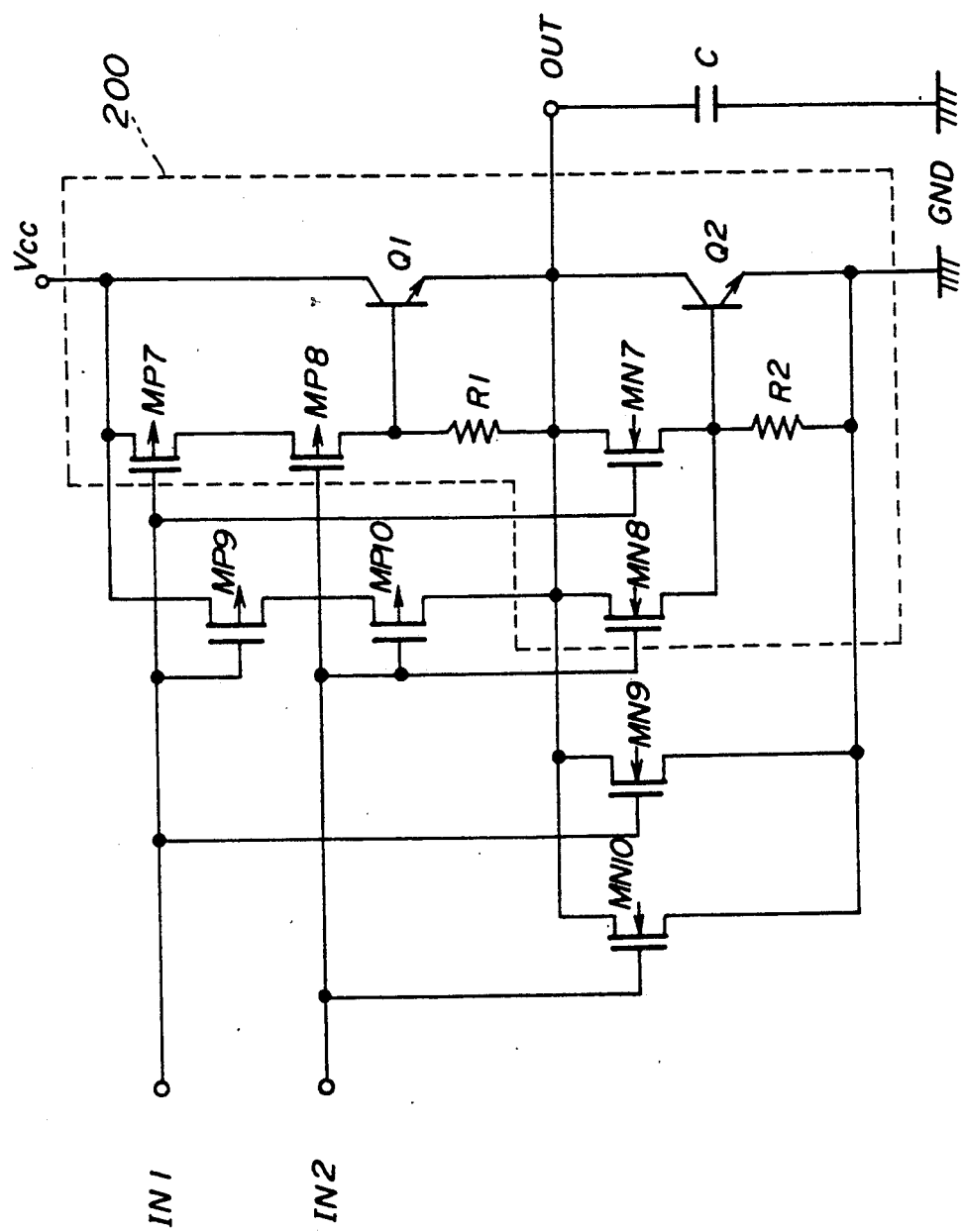
FIG. 6 is a circuit diagram of a Bi-CMOS logic circuit according to a third preferred embodiment of the present invention.

A description will now be given of a Bi-CMOS circuit according to a third preferred embodiment of the present invention with reference to FIG. 6. The Bi-CMOS circuit shown in FIG. 6 is a two-input NOR gate. A conventional NOR gate 200 is composed of two bipolar transistors Q1 and Q2, two P-channel MOS transistors MP7 and MP8 and two N-channel MOS transistors MN7 and MN8. According to the third embodiment of the present invention, two P-channel MOS transistors MP9 and MP10 and two N-channel MOS transistors MN9 and MN10 are added to the conventional NOR gate 200. The MOS transistors MP9 and MP10 are connected in series between the collector and emitter of the bipolar transistor Q1. That is, the source of the MOS transistor MP9 is connected to the collector of the bipolar transistor Q1, and the drain thereof is connected to the source of the MOS transistor MP10. The drain of the MOS transistor MP10 is connected to the emitter of the bipolar transistor Q1. The input signals IN1 and IN2 are applied to the gates of the MOS transistors MP9 and MP10, respectively. Each of the MOS transistors MN9 and MN10 are connected between the collector and emitter of the bipolar transistor Q2. The input signals IN1 and IN2 are applied to the gates of the MOS transistors MN9 and MN10, respectively.

The MOS transistors MP7 and MP8 are connected in series between the collector and base of the bipolar transistor Q1. Each of the MOS transistors MN7 and MN8 is connected between the collector and base of the bipolar transistor Q2. The input signals IN1 and IN2 are applied to the gates of the MOS transistors MN7 and MN8, respectively.

It is now assumed that the input signals IN1 and IN2 are at the high level and no charge is stored in the wiring load capacitance C. When both the input signals IN1 and IN2 change from the high level to the low level, all the P-channel MOS transistors are ON, and all the N-channel MOS transistors are OFF. Current from the power source Vcc passes through the bipolar transistor Q1 and charges the wiring load capacitance C. When the output voltage has become equal to $Vcc - V_{BE}$ (base-emitter voltage of the bipolar transistor Q1), the bipolar transistor Q1 cannot pass current. After that, the current from the power source Vcc starts to pass through the MOS transistors MP9 and MP10 and charges the wiring load capacitance C. Thus, the output voltage is increased to the high level rapidly. It will be noted that the current drivability of each of the MOS transistors MP9 and MP10 is greater than the resistor R1.

When the input signal IN1 changes from the low level to the high level while the input signal IN2 is maintained at the low level, the MOS transistors MP7 and MP9 are turned OFF and the MOS transistors MN7 and MN9 are turned ON. Current resulting from a charge stored in the wiring load capacitance C passes through the bipolar transistor Q2 so that the output voltage decreases by $Vcc - V_{BE}$ (base-emitter voltage of the bipolar transistor Q2). When the output voltage has become equal to $Vcc - V_{BE}$, the bipolar transistor Q2 cannot pass current. After that, the current from the wiring load capacitance C starts to pass through the MOS transistor MN9 so that the output voltage becomes equal to the low level rapidly.

In the above-mentioned third embodiment of the present invention, it is also possible to provide only a pair of MOS transistors MP9 and MN9 or a pair of MOS transistors MP10 and MN10.

Figure 7:
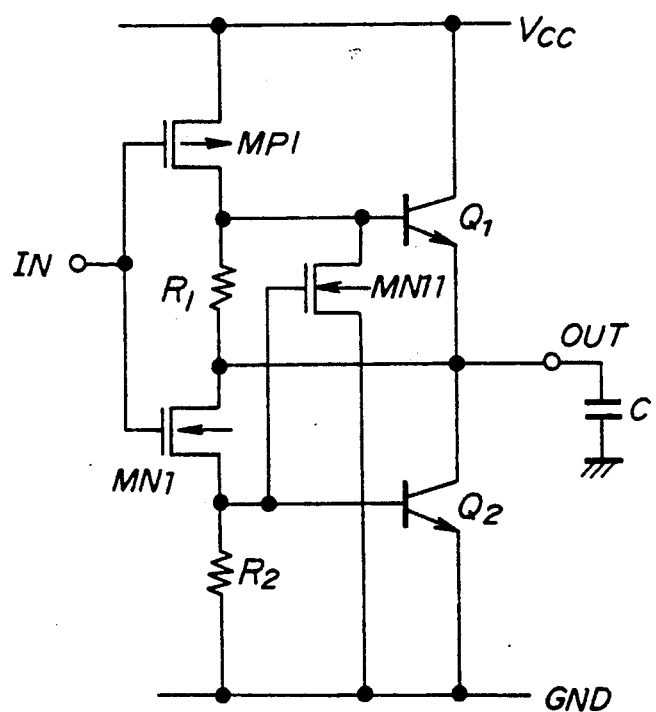
FIG. 7 is a circuit diagram of a Bi-CMOS logic circuit according to a fourth preferred embodiment of the present invention.

A description will now be given of a Bi-CMOS circuit according to a fourth preferred embodiment of the present invention with reference to FIG. 7. The Bi-CMOS circuit shown in FIG. 7 is configured by adding an N-channel MOS transistor MN11 to the circuit shown in FIG. 1. The drain of the MOS transistor MN11 is connected to the base of the bipolar transistor Q1, and the source thereof is grounded. The gate of the MOS transistor MN11 is connected to the source of the MOS transistor MN1 and the base of the bipolar transistor Q2.

When the input signal IN changes from the low level to the high level, the MOS transistor MP1 and the bipolar transistor Q1 are turned OFF, and the MOS transistor MN1 is turned ON. Thus, the MOS transistor MN1 allows the charges stored in the wiring load capacitance C and the parasitic capacitances related to the MOS transistor MP1, the resistor R1 and the bipolar transistor Q1 to pass therethrough. As a result, the output signal OUT decreases toward the low (ground) level.

The charges passing through the MOS transistor MN1 function as a current, which develops a voltage drop across the resistor R2. When the voltage developed across the resistor R2 is sufficient to turn ON the bipolar transistor Q2, the bipolar transistor Q2 turns ON. Thereby, the change of the output signal OUT is accelerated. Further, the MOS transistor MN11 turns ON. As the wiring load capacitance C and the parasitic charges are being discharged, the output signal OUT decreases toward the low (ground) level and the current passes through the base-emitter junction of the bipolar transistor Q2. When the base-emitter voltage of the bipolar transistor Q2 has decreased to about 0.8 volts, the bipolar transistor Q2 turns OFF. Thus, the discharge path via the bipolar transistor Q2 is lost, so that the discharge path having the MOS transistor MN1 and the discharge path having the MOS transistor MN11 allow the rest of the charges stored in the wiring load capacitance C and the parasitic capacitances related to the bipolar transistor Q1, the resistor R1 and the MOS transistor MN1 to pass therethrough. As a result, the output signal OUT is rapidly changed to the ground level.

Figure 8:
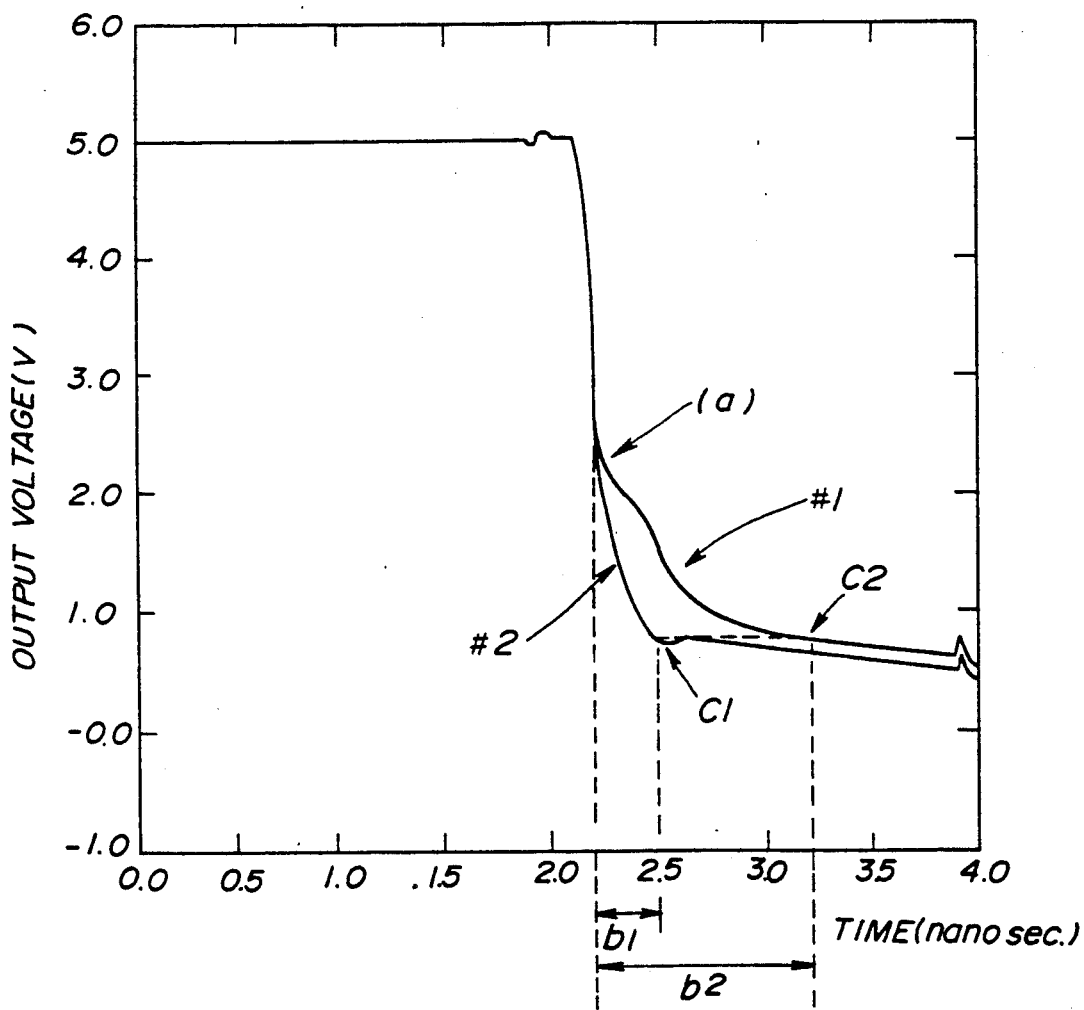
FIG. 8 is a graph illustrating an advantage presented by the fourth embodiment of the present invention shown in FIG. 7, as compared with the conventional circuit shown in FIG. 1.

FIG. 8 is a graph illustrating the advantage provided by the above-mentioned fourth embodiment of the present invention. Curve #2 represents a change of the output signal OUT as a function of time obtained by the fourth embodiment of the present invention. Curve #1 represents a change of the output signal OUT as a function of time obtained by the circuit shown in FIG. 1. During time $b_1$, the ability of the bipolar transistor Q2 to discharge the capacitances is decreasing. However, the other two discharge paths respectively having the MOS transistors MN1 and MN11 are still available. Thus, the output signal OUT decreases rapidly during the time $b_1$. On the other hand, the output signal of the conventional circuit shown in FIG. 1 only gradually decreases, as shown by the curve #1. It should be noted that it takes a longer time $b_2$ to obtain potential C2 equal to potential C1 of the output signal OUT obtained at the end of the period $b_1$ by the circuit of FIG. 7, as shown in FIG. 8.

Figure 9:
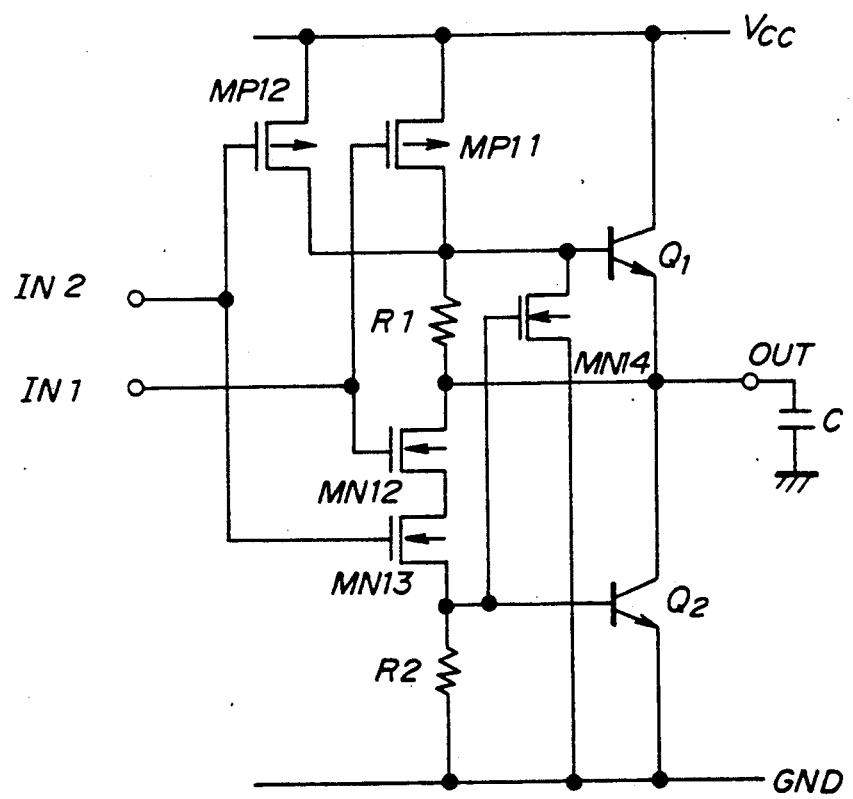
FIG. 9 is a circuit diagram of a Bi-CMOS logic circuit according to a fifth preferred embodiment of the present invention.

A description will now be given of a Bi-CMOS circuit according to a fifth preferred embodiment of the present invention with reference to FIG. 9. The Bi-CMOS circuit shown in FIG. 9 is a two-input NAND circuit. A conventional NAND circuit is made up of two P-channel MOS transistors MP11 and MP12, two N-channel MOS transistors MN12 and MN13, and two bipolar transistors Q1 and Q2. According to the fifth preferred embodiment of the present invention, an N-channel MOS transistor MN14 is added to the conventional NAND circuit.

The sources of the MOS transistors MP11 and MP12 are connected to the Vcc line, and the drains thereof are connected to the base of the bipolar transistor Q1. The gates of the MOS transistors MP11 and MP12 are supplied with the input signals IN1 and IN2, respectively. The gates of the MOS transistors MN12 and MP13 are supplied with the input signals IN1 and IN2, respectively. The MOS transistors MN12 and MN13 are connected in series. The drain of the MOS transistor MN12 is connected to the emitter of the bipolar transistor Q1, and the source thereof is connected to the drain of the MOS transistor MN13. The source of the MOS transistor MN13 is grounded through the resistor R2.

The drain of the MOS transistor MN14 is connected to the base of the bipolar transistor Q1, and the source thereof is grounded. The gate of the MOS transistor MN14 is connected to the base of the bipolar transistor Q2 because the MOS transistor MN14 must turn ON only when both the input signals IN1 and IN2 change to the high level.

When both the input signals IN1 and IN2 change from the low level to the high level, the MOS transistors MN12 and MN13 are turned ON. Then, the circuit shown in FIG. 9 operates as described previously with reference to FIG. 7.

It is possible to configure an NAND circuit receiving three or more input signals in the same way as the two NAND circuit shown in FIG. 9. In this alternative, the gate of the MOS transistor MN14 is connected to a node at which the resistor R2 is connected to the source of the MOS transistor corresponding to the MOS transistor MN13.

The present invention is not limited to the specifically described embodiments, variations and modifications may be made without departing from the scope of the present invention.

What is claimed is:

1. A Bi-CMOS logic circuit comprising:
   first and second bipolar transistors connected in series between a first power source and a second power source, an output signal being drawing from a connection node at which said first and second bipolar transistors are connected in series;
   first impedance means, connected between the base and the emitter of said first bipolar transistor, for providing a first impedance;
   second impedance means, connected between the base of said second bipolar transistor and the emitter thereof, for providing a second impedance;
   a first MOS transistor connected between the collector of said first bipolar transistor and the base thereof;
   a second MOS transistor connected between the collector of said second bipolar transistor and the base thereof, an input signal being applied in common to the gates of said first and second MOS transistors; and
   a third MOS transistor connected between the base of said first bipolar transistor and said second power source, said third MOS transistor having a gate connected to the base of said second bipolar transistor.

2. A Bi-CMOS logic circuit as claimed in claim 1, wherein each of said second and third MOS transistors is an N-channel MOS transistor, and said first MOS transistor is a P-channel MOS transistor.

3. A Bi-CMOS logic circuit as claimed in claim 1, wherein each of said first and second impedance means comprises a resistor.

4. A Bi-CMOS logic circuit comprising:
   first and second bipolar transistors connected in series between a first power source and a second power source, an output signal being drawn from a connection node at which said first and second bipolar transistors are connected in series;
   first impedance means, connected between the base and the emitter of said first bipolar transistor, for providing a first impedance;
   second impedance means, connected between the base of said second bipolar transistor and the emitter thereof, for providing a second impedance;
   a first group of n MOS transistors connected in parallel between the base and collector of said first bipolar transistor where n is an integer, said n MOS transistors of the first group having respective gates respectively receiving n corresponding input signals;
   a second group of n MOS transistors connected in series between the base and the collector of said second bipolar transistor, said n MOS transistors of said second group having respective gates respectively receiving said corresponding n input signals; and
   a discharge MOS transistor connected between the base of said first bipolar MOS transistor and said second power source, said discharge MOS transistor having the gate thereof connected to the base of said second bipolar transistor.

5. A Bi-CMOS logic circuit as claimed in claim 1, wherein said n MOS transistors of the first group are respectively P-channel MOS transistors, and said n MOS transistors of the second group and said discharge MOS transistor are respectively N-channel MOS transistors.

6. A Bi-CMOS logic circuit as claimed in claim 4, wherein each of said first and second impedance means comprises a resistor.

* * * * *